United States Patent [19]
Nakaizumi

[11] Patent Number: 4,570,083
[45] Date of Patent: Feb. 11, 1986

[54] DIGITAL CIRCUIT

[75] Inventor: Kazuo Nakaizumi, Tokyo, Japan

[73] Assignee: Nippon Electric Co., Ltd., Tokyo, Japan

[21] Appl. No.: 457,596

[22] Filed: Jan. 13, 1983

[30] Foreign Application Priority Data

Jan. 13, 1982 [JP] Japan .................. 57-3787

[51] Int. Cl.[4] .................. H03K 17/16; H03K 17/693
[52] U.S. Cl. ................... 307/443; 307/453; 307/481; 307/577; 307/269; 307/605
[58] Field of Search ............. 307/443, 480, 451–453, 307/481, 572, 576, 577, 582–585, 263, 269, 270, 601, 605; 365/203, 233

[56] References Cited

U.S. PATENT DOCUMENTS

| | | | |
|---|---|---|---|
| 4,129,792 | 12/1978 | Kawagai et al. | 307/263 X |
| 4,222,112 | 9/1980 | Clemons et al. | 365/203 X |
| 4,404,474 | 9/1983 | Dingwall | 307/443 X |
| 4,414,480 | 11/1983 | Zasio | 307/443 |
| 4,417,329 | 11/1983 | Mezawa et al. | 307/453 X |
| 4,458,336 | 7/1984 | Takemae | 365/203 X |

OTHER PUBLICATIONS

Chao et al., "Bit Line Precharging Circuit", IBM Tech. Disc. Bull., vol. 24, No. 4, Sep. 1981, pp. 2036–2037.

Primary Examiner—John S. Heyman
Assistant Examiner—D. R. Hudspeth
Attorney, Agent, or Firm—Sughrue, Mion, Zinn Macpeak & Seas

[57] ABSTRACT

A precharge circuit which suppresses a peak of a charge current in conducting a precharge operation is disclosed.

The precharge circuit comprises a precharge transistor for feeding the precharge current and means for generating a precharge control signal which changes slowly only when the precharge control signal is near an intermediate level of the specified binary levels of the precharge signal and changes quickly when the precharge control signal is not near the intermediate level.

10 Claims, 10 Drawing Figures

DIGITAL CIRCUIT

BACKGROUND OF THE INVENTION

The present invention relates to a digital circuit, and more particularly to a precharge circuit for a digital circuit employing field-effect transistors.

Digital circuits widely adopt the precharge technique in which predetermined circuit nodes are all charged to a predetermined potential. Subsequently, charges accumulated at the selected circuit nodes are discharged to determine logic levels. This precharge technique is advantageous in that there is low power consumption and high speed operation.

For example, in a memory circuit, a plurality of digit lines to which memory cells are connected, are precharged from a precharge voltage source through precharge transistors coupled between the respective digit lines and the precharge voltage source prior to each operation. In performing the precharge, a precharge control signal is commonly applied to the precharge transistors. The precharge control signal is usually generated as an output signal of an inverter which receives a basic control signal such as a chip enable signal and with a predetermined slope it changes from the one of the binary logic levels which makes the precharge transistors non-conducting to the other of the binary logic levels which makes the precharge transistors conducting.

When the precharge control signal changes from the above one of the binary logic levels towards the other of the binary logic levels, a potential at the gates of the precharge transistors similarly changes and the precharge transistors become conducting to feed circuit nodes such as digit lines with currents. The potential at the circuit nodes to be charged is gradually raised as time elapses. This raise of potential at the circuit nodes functions to reduce the gate-source voltage bias of the precharge transistors. Therefore, amount of currents fed through the precharge transistors is increased in accordance with the shift in potential of the precharge control signal towards the other of the binary logic levels until a predetermined time point. It is then decreased in accordance with the potential raise at the circuit nodes to be charged. Accordingly, the amount of current fed throughout the precharge inevitably takes a peak value. In general, if a current having a large peak value flows in a circuit, then various harmful noises are generated and in the worst case malfunction of the circuit would be caused.

In order to reduce the peak value of the current, conductances of the precharge transistors could be reduced. Also, the rate at which the precharge voltage is applied can be reduced to moderate the peak value of the precharge current. However, if this technique were employed, there would be a disadvantage in that the time required for completing the precharge would be prolonged, resulting in a low speed operation.

It is one object of the present invention to provide a precharge circuit in which the peak value of a charging current can be made small without prolonging the charging time.

SUMMARY OF THE INVENTION

In the present invention, as a precharge control signal is applied to a precharge transistor for controlling the feed of a precharge current to a circuit portion to be charged, such a signal when in the process of its level change from the one of the binary logic levels which makes the precharge transistor non-conducting to the other of the binary logic levels which makes the transistor conducting, is temporarily held at an intermediate level of the binary logic levels, or its change rate towards the other level is temporarily made small near the intermediate level.

In other words, the precharge control signal employed in the present invention is once changed from the one of the binary logic levels to the intermediate level which makes the precharge transistor slightly conducting at a relatively high speed and it is temporarily held at the intermediate level for a predetermined period or it is slowly changed near the intermediate level at a low speed, and then it is changed from the intermediate level to the other of the binary logic levels at a relatively high speed.

According to the present invention, since the precharge control signal is once held at the intermediate level or its change rate is made very small near the intermediate level, effective conductance of the precharge transistor at that time is limited to a relatively low value or moderated and hence the peak value of the current fed through the precharge transistor is also limited to a small value. As a result, the wave form of the precharge current is made moderate throughout the precharge operation without prolonging the period of time of the precharge operation.

Now with reference to the drawings, the present invention will be explained in detail. In the following explanation, a CMOS structure in which N-channel field effect transistors and P-channel field effect transistors are included is employed by way of example and the logic "1" or high level corresponds to a power supply voltage (Vcc) while the logic "0" or low level corresponds to the ground potential.

First, with reference to FIGS. 1 and 2 a precharge circuit according to the prior art will be described.

Figure 1:
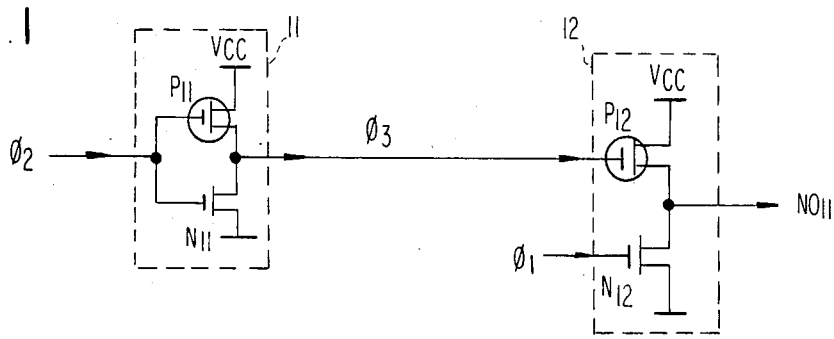
FIG. 1 is a circuit diagram showing a precharge circuit in the prior art.
Figure 2:
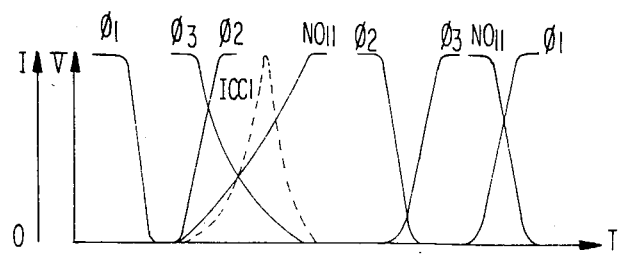
FIG. 2 is a timing chart for explaining the operation of the circuit of FIG. 1.

In FIG. 1, a precharge signal generator portion 11 for generating a precharge control signal $\phi_3$ and a portion 12 forming the precharge circuit is illustrated. In this circuit, P-channel transistors $P_{11}$ and $P_{12}$, and N-channel transistors $N_{11}$ and $N_{12}$ are employed, and a node NO11 is precharged. The precharge signal generator portion 11 is constructed of a CMOS inverter circuit consisting of the transistors $P_{11}$ and $N_{11}$.

A description will now be made of the operation of the circuit of the prior art with reference to a timing chart shown in FIG. 2. First, when a first control signal $\phi_1$ is at "1"-level (Vcc), the transistor $N_{12}$ is turned ON to bring the node NO11 to be charged to "0"-level (ground level). Subsequently, when the first control signal $\phi_1$ takes "0"-level, the transistor $N_{12}$ is turned OFF, and then if a second control signal $\phi_2$ becomes "1"-level, then the precharge control signal $\phi_3$ falls in potential gradually from "1"-level (Vcc potential) and takes "0"-level, and hence the transistor $P_{12}$ is turned ON to start charging. As a result, the node NO11 to be charged is brought to a charged level, i.e., "1"-level. Next, when the second control signal $\phi_2$ becomes "0"-level, the precharge control signal $\phi_3$ becomes "1"-level, hence the transistor $P_{12}$ is turned OFF. Subsequently when the first control signal $\phi_1$ becomes "1"-level, the node NO11 to be charged is returned to "0"-level through the transistor $N_{12}$.

The above-mentioned circuit in the prior art had the following disadvantage. That is, in FIG. 2, when the precharge control signal $\phi_3$ changes from "1"-level to "0"-level, the node NO11 to be charged would be raised in potential, but at this moment a large peak value would arise in the charging current $I_{cc1}$ of the $NO_{11}$. In general, if a current having a large peak value flows in a circuit, then various harmful noises are generated thereby, and so, it is undesirable. In order to reduce this peak value, a method could be employed reducing the size of the transistor $N_{11}$ thereby moderating the slope of the precharge signal $\phi_3$. Alternatively the size of the charging transistor $P_{12}$ could be reduced. However, if these methods are employed, there is a disadvantage in that the time required for charging the node $NO_{11}$ to be charged is prolonged.

Now description will be made on a first preferred embodiment of the present invention with reference to FIGS. 3 and 4.

Figure 3:
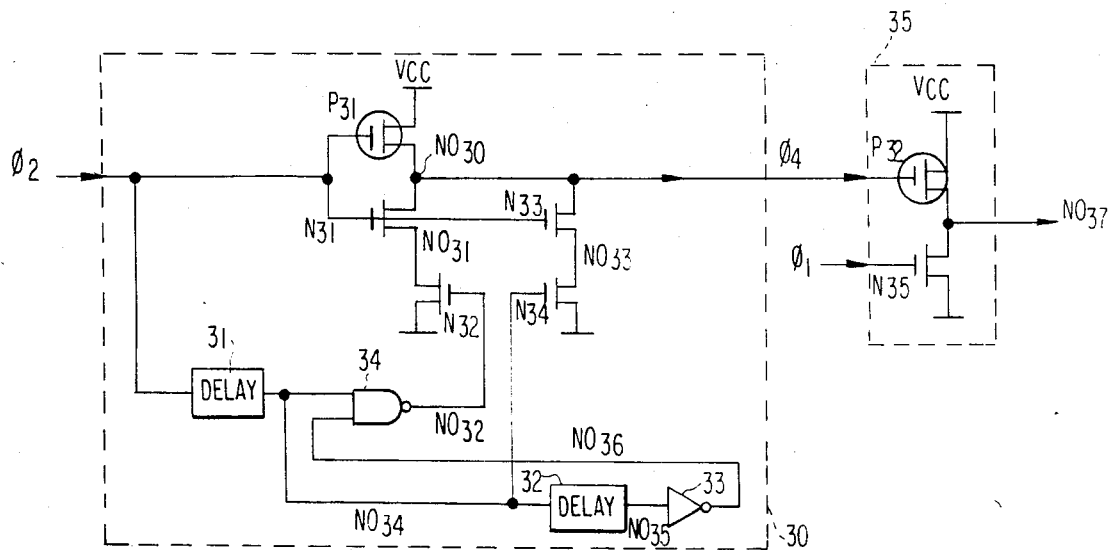
FIG. 3 is a circuit diagram of a first preferred embodiment of the present invention.
Figure 4:
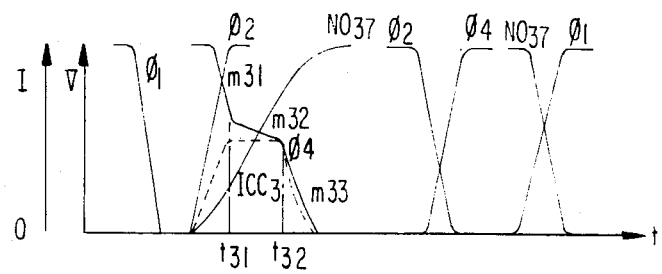
FIG. 4 is a timing chart for explaining the operation of the circuit of FIG. 3.

As shown in FIG. 3, a precharge circuit is basically composed of a precharge signal generator portion 30 for generating a precharge control signal $\phi_4$ and a precharge portion 35 responsive to the precharge control signal $\phi_4$ for charging a node $NO_{37}$. The precharge portion 35 includes a P-channel transistor $P_{32}$ as a precharge transistor coupled between the node $NO_{37}$ and a power supply terminal $V_{cc}$ and an N-channel transistor $N_{35}$ coupled between the node $NO_{37}$ and the ground potential. A circuit structure of the precharge portion 35 is basically the same as the portion 12 of FIG. 1. The transistor $P_{32}$ charges the node $NO_{37}$ in response to "0" or low level of the precharge control signal $\phi_4$. The N-channel transistor $N_{35}$ discharges the charge at the node $NO_{37}$ in response to "1" or high level of a first control signal $\phi_1$. The existense of the transistor $N_{35}$ is not essential to the present invention.

The precharge control signal generator portion 30 receives a second control signal $\phi_2$ as a basic signal for controlling the precharge operation and generates the precharge control signal $\phi_4$. The precharge control signal generator portion 30 includes a P-channel transistor $P_{31}$ coupled between the power supply terminal ($V_{cc}$) and an output node $NO_{30}$ and having a gate receiving the signal $\phi_2$, N-channel transistors $N_{31}$ and $N_{32}$ connected in series between the output node $NO_{30}$ and the ground potential, N-channel transistors $N_{33}$ and $N_{34}$ connected in series between the output node $NO_{30}$ and the ground potential. Gates of the transistors $N_{31}$ and $N_{33}$ receive the signal $\phi_2$. For controlling the transistors $N_{32}$ and $N_{34}$, delay circuits 31 and 32, a NAND gate 34 and an inverter 33 are provided. The delay circuit 31 receives the signal $\phi_2$. An output signal of the delay circuit 31 is applied to a gate of the transistor $N_{34}$, a first input terminal of the NAND gate 34, and an input terminal of the delay circuit 32. An output of the delay circuit 32 is fed to a second input terminal of the NAND gate 34 through the inverter 33. An output signal of the NAND gate 34 is applied to a gate of the transistor $N_{32}$.

In this circuit, an effective conductance of the series circuit of the transistors $N_{31}$ and $N_{32}$ is set far larger than that of the series circuit of the transistors $N_{33}$ and $N_{34}$. For achieving this the conductances of the transistors $N_{32}$ and $N_{34}$ are made substantially the same, while the conductance of the transistor $N_{31}$ is made larger than that of the transistor $N_{33}$.

The operation of this preferred embodiment will now be explained with reference to a timing chart shown in FIG. 4.

When the first control signal $\phi_1$ is at "1"-level, the transistor $N_{35}$ is turned ON and brings the node $NO_{37}$ to be charged to "0"-level i.e., discharged. Subsequently the first control signal $\phi_1$ becomes "0"-level and the transistor $N_{35}$ is turned OFF. In this instance, the signal $\phi_2$ is at "0" level, and the output signal at a node $NO_{34}$ of the delay circuit 31 is still at "0" level, and therefore the output signal at a node $NO_{32}$ of the gate 34 is at "1" level. Therefore, the transistor $N_{32}$ is conducting. Next, when the second control signal $\phi_2$ changes from "0"-level to "1"-level, then the transistor $P_{31}$ is turned OFF and the transistors $N_{31}$ and $N_{33}$ are turned ON, so that the precharge control signal $\phi_4$ begins to fall in potential from "1"-level ($V_{cc}$ potential) with a large gradient $m_{31}$ that is determined by the serial ON resistances of the transistors $N_{31}$ and $N_{32}$. Thereby the transistor $P_{32}$ is turned ON to start charging of the node $NO_{37}$ to be charged. Then, as the potential of the precharge signal $\phi_4$ falls, the conductance of the transistor $P_{32}$ rises, and hence, the charging current $I_{cc3}$ for the node $NO_{37}$ to be charged is gradually increased. On the other hand, after the second control signal $\phi_2$ is turned to "1"-level, the node $NO_{34}$ is brought to "1"-level via the delay circuit 31, and hence the transistor $N_{34}$ is turned ON. In this instance, the node $NO_{32}$ is brought to "0"-level through the NAND circuit 34 because the node $NO_{34}$ is at "1" level and the node $NO_{35}$ is still at "0" level by a delay time of the delay circuit 32 to set the node $NO_{36}$ at "1" level. Hence, the transistor $N_{32}$ is turned OFF. (The moment when the transistor 32 is turned OFF is indicated by $t_{31}$.) In other words, at the moment $t_{31}$, the current path which causes potential drop of the precharge signal $\phi_4$ is switched from the transistors $N_{31}$ and $N_{32}$ to the transistors $N_{33}$ and $N_{34}$. By selecting the sizes of the transistors $N_{33}$ and $N_{34}$ smaller (for instance by a factor of 1/5) than the transistor sizes of the transistors $N_{31}$ and $N_{32}$, the precharge control signal $\phi_4$ presents a moderate slope indicated by $m_{32}$ that is determined by the ON resistances of the transistors $N_{33}$ and $N_{34}$. Consequently, the rise of the conductance of the transistor $P_{32}$ also becomes moderate or suppressed. Therefore, the charging current $I_{cc3}$ becomes nearly constant. Subsequently, the node $NO_{35}$ becomes "1"-level via the delay circuit 32 after a delay time of the delay circuit 32, and the node $NO_{36}$ becomes "0"-level via the inverter circuit 33. Then, the node $NO_{32}$ again becomes "1"-level via the NAND circuit 34, and consequently, the transistor $N_{32}$ is turned ON. (The moment when the transistor $N_{32}$ is turned ON is indicated by $t_{32}$.)

Thereby, the rate of change of the precharge control signal $\phi_4$ again takes a steep slope indicated by $m_{33}$ towards OV. Therefore, the conductance of the transistor $P_{32}$ again starts to quickly rise, but at the moment $t_{32}$ in FIG. 4, the potential at the node $NO_{37}$ to be charged has been already come close to the $V_{cc}$ potential (for instance 80% or higher of the $V_{cc}$ potential), and hence the value of the charging current $I_{cc3}$ begins to reduce. Subsequently, when the second input signal $\phi_2$ becomes "0"-level, the transistor $P_{31}$ is turned ON, the transistors $N_{31}$ and $N_{33}$ are turned OFF, hence the precharge control signal $\phi_4$ takes "1" level, and the transistor $P_{32}$ is turned OFF. Next, the first control signal $\phi_1$ takes "1" level to bring the node $NO_{37}$ to be charged to "0"-level.

One example of application of this invention will now be shown. That case is where the above-described precharge control signal $\phi_4$ is used as a precharge control signal for a digit line in a memory circuit. The explanation will be made with reference to FIGS. 5 and 6.

Figure 5:
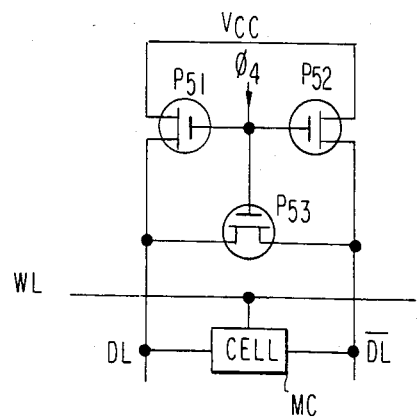
FIG. 5 is a circuit diagram of one example of an application of the present invention.

In FIG. 5, a memory cell MC is arrayed at an intersection of a word line WL and a pair of digit lines DL and $\overline{DL}$. In this structure, the pair of digit lines DL and $\overline{DL}$ are precharged by P-channel transistors $P_{51}, P_{52}$ and $P_{53}$ in response to "0"-level of the precharge control signal $\phi_4$.

Figure 6:
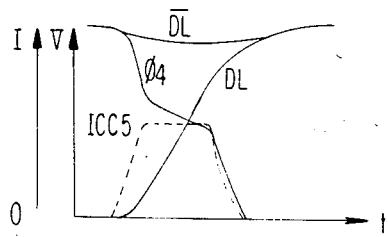
FIG. 6 is a timing chart for explaining the operation of the circuit of FIG. 5.

The operation of the circuit in FIG. 5 will now be explained with reference to a timing chart in FIG. 6. The threshold voltage of the transistors $P_{51}$ to $P_{53}$ is represented by $V_{TP}$. During read or write operations the precharge control signal $\phi_4$ is at a "1"-level, and hence the transistors $P_{51}$ to $P_{53}$ are in an OFF state. In addition, at a time point when the above-mentioned operation has completed, one (DL) of the digit lines is at "0" level. Subsequently when it has transferred to a precharge state, the precharge control signal $\phi_4$ begins to fall in potential, and if the potential becomes a potential equal to or lower than $V_{cc} - |V_{TP}|$, then the transistors $P_{51}$ to $P_{53}$ are turned ON, and thereby the digit line DL begins to be charged. As the potential of the precharge control signal $\phi_4$ falls, the conductances of the transistors $P_{51}$ to $P_{53}$ are increased, and hence the value of the charging current $I_{cc5}$ for the digit line DL becomes large gradually. Subsequently, when the slope of the precharge control signal $\phi_4$ becomes moderate, the rise of the conductances of the transistors $P_{51}$ to $P_{53}$ becomes moderate. Consequently, the charging current $I_{cc5}$ becomes nearly constant. After the potential of the DL line has risen to about 80 to 90% of the $V_{cc}$ potential, the slope of the precharge control signal $\phi_4$ again becomes steep, and the conductances of the transistors $P_{51}$ to $P_{53}$ begin to rise and the digit line rises towards the $V_{cc}$ potential, but the charging current is reduced.

In general, in a memory circuit, the large peak current appearing as a charging current for digit lines, is a problem and one of the important points which must be considered when designing a memory circuit and also when designing a system employing the memory circuit. More particularly, although the capacitance of a digit line in a memory circuit is small (for instance 1 pF), as the memory increases in size, the number of digit lines is increased, and the total capacitance due to the digit lines is large. For instance, in a memory circuit of 16K bits, the number of the digit lines is sometimes 128, and hence in the prior art, the peak current value produced upon charging these digit lines amounted to as much as 150 mA. In a high-speed, large-capacity memory circuit, a large number of digit lines must be charged within a short period, and accordingly, as explained above with respect to the illustrated example, it is obvious that the present invention can bring about a large advantage.

Figure 7:
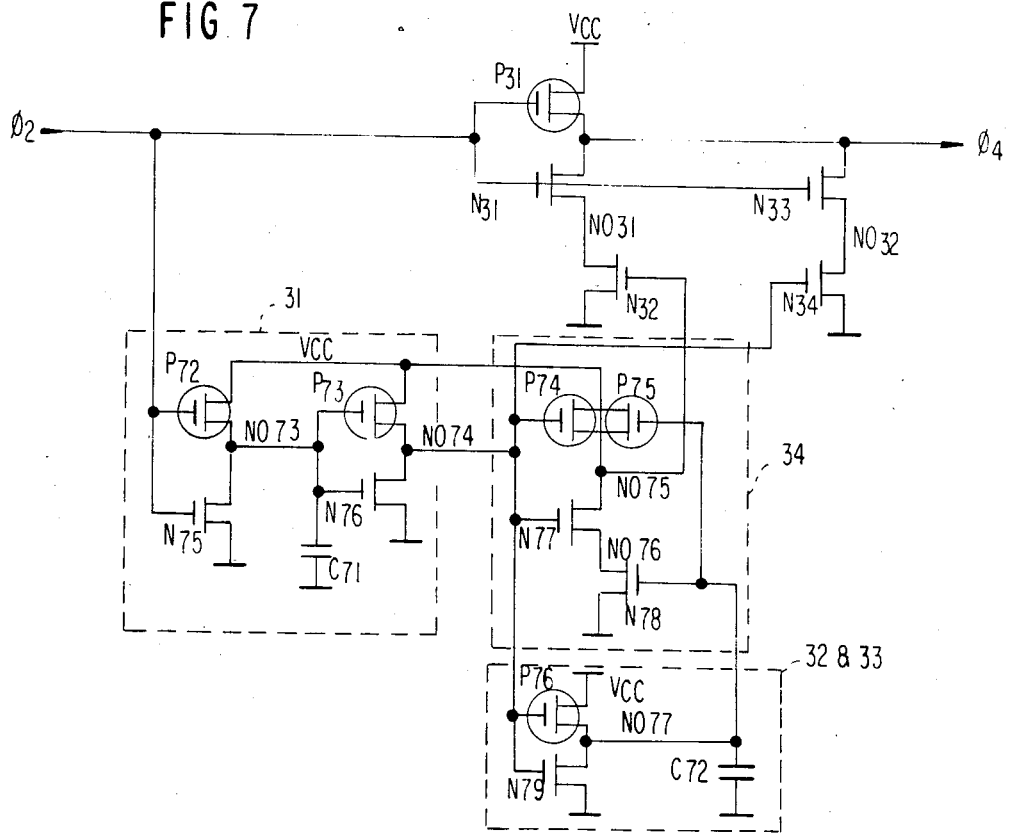
FIG. 7 is a circuit diagram of a second preferred embodiment of the present invention.

Now, a second preferred embodiment of the present invention will be explained with reference to FIG. 7.

This embodiment shows an detailed example of the embodiment of FIG. 3. As will be apparent from the figure, in this preferred embodiment the logic blocks 31, 32, 33 and 34 in the above-described first preferred embodiment are replaced by corresponding circuits having transistors of CMOS construction. Accordingly, the operation is similar to the case of the above-described first preferred embodiment. Hence, only the correspondence between FIGS. 3 and 7 will be explained here. Logic circuits 31 through 34 are comprised of P-channel transistors $P_{72}$ to $P_{76}$ and N-channel transistors $N_{75}$ to $N_{79}$. The transistors $P_{72}, N_{75}, P_{73}$ and $N_{76}$ and the additive capacitance $C_{71}$ form a CMOS delay circuit 31 which corresponds to the delay circuit indicated with the same reference number in FIG. 3. The transistors $P_{76}$ and $N_{79}$ and the additive capacitance $C_{72}$ form a CMOS delay circuit and an inverter circuit in combination which corresponds to the delay circuit 32 and the inverter circuit 33 in FIG. 3. The transistors $P_{74}, P_{75}, N_{77}$ and $N_{78}$ form a CMOS NAND circuit 34 which corresponds to the NAND circuit 34 with the same reference number in FIG. 3.

Now a third preferred embodiment of the present invention will be explained with reference to FIGS. 8 and 9.

Figure 8:
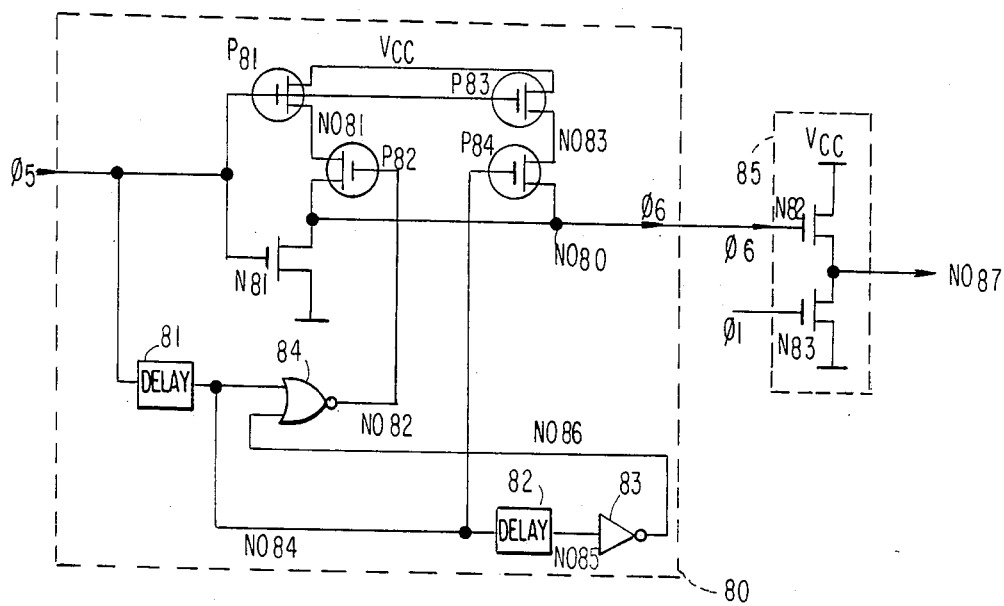
FIG. 8 is a circuit diagram of a third preferred embodiment of the present invention.
Figure 9:
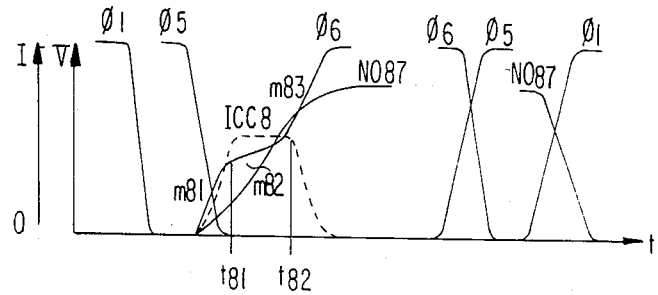
FIG. 9 is a timing chart for FIG. 8.

In FIG. 8, a precharge control signal generator portion 80 receives a second control signal $\phi_5$ and generates a precharge control signals $\phi_6$ to be applied to a precharge transistor. A precharge portion 85 includes an N-channel transistor $N_{82}$ coupled between the power supply terminal ($V_{cc}$) and a node $NO_{87}$ to be precharged and an N-channel transistor $N_{83}$ coupled between the node $NO_{87}$ and the ground potential. The transistor $N_{82}$ charges the node $NO_{87}$ in response to a "1" level of the precharge control signal $\phi_6$ while the transistor $N_{83}$ discharges the node $NO_{87}$ in response to a "1"-level of the first control signal $\phi_1$.

The precharge control signal generator portion 80 includes a series circuit of P-channel transistors $P_{81}$ and $P_{82}$ and a series circuit of P-channel transistors $P_{83}$ and $P_{84}$ both connected in series between the power supply terminal ($V_{cc}$) and an output node $NO_{80}$, and an N-channel transistor $N_{81}$ coupled between the node $NO_{80}$ and the ground potential. Delay circuits 81 and 82, an inverter 83 and a NOR gate 84 are provided for controlling the transistors $P_{82}$ and $P_{84}$.

Next will be described the operation of the preferred embodiment in FIG. 8 with reference to a timing chart shown in FIG. 9. When the first control signal $\phi_1$ is at "1"-level, the transistor $N_{83}$ is turned ON, and so, the node $NO_{87}$ to be charged is brought to "0"-level. Subsequently, the first control signal $\phi_1$ becomes "0"-level. Hence, the transistor $N_{83}$ is turned OFF. Then, when the second control signal $\phi_5$ changes from "1" level to "0"-level, the transistor $N_{81}$ is turned OFF, while the transistors $P_{81}$ and $P_{83}$ are turned ON, so that the precharge signal $\phi_6$ rises in potential at a slope $m_{81}$ that is determined by ON resistances of the respective transistors $P_{81}$ and $P_{82}$ starting from "0"-level. In response thereto, the transistor $N_{82}$ is turned ON to start charging of the node $NO_{87}$ to be charged. Since the conductance of the transistor $N_{82}$ becomes large, the charging current $I_{cc8}$ for the node $NO_{87}$ to be charged would be increased gradually. On the other hand, when the second control signal $\phi_5$ becomes "0"-level, the node $NO_{84}$ is brought to "0"-level through the delay circuit 81, the transistor $P_{84}$ is turned ON, the node $NO_{82}$ is brought to "1"-level via the NOR circuit 84, and the transistor $P_{82}$ is turned OFF. (The moment when the transistor $P_{82}$ is turned OFF is indicated by $t_{81}$.) In other words, at the moment $t_{81}$, the path of the current for potential rise of the precharge signal $\phi_6$ is switched from the transistors $P_{81}$ and $P_{82}$ to the transistors $P_{83}$ and $P_{84}$. By selecting the transistor sizes of the transistors $P_{83}$ and $P_{84}$ smaller (for instance, by a factor of 1/5) than the transistor sizes of the transistors $P_{81}$ and $P_{82}$, the precharge signal $\phi_6$ can take a moderate slope as indicated by $m_{82}$ which is determined by the ON resistances of the respective transistors $P_{83}$ and $P_{84}$. Consequently, the rise of the conductance of the transistor $N_{82}$ also becomes moderate, and so the charging current $I_{cc8}$ becomes nearly constant. Subsequently, the node $NO_{85}$ is brought to the "0"-level via the delay circuit 82, the node $NO_{86}$ is brought to "1"-level via the inverter circuit 83, the node $NO_{82}$ is again brought to "0"-level via the NOR circuit 84 and the transistor $P_{82}$ is turned ON. (The moment when the transistor $P_{82}$ is turned on is indicated by $t_{82}$.) As a result, the precharge control signal $\phi_6$ again takes a steep slope as indicated by $m_{83}$ and increases towards the $V_{cc}$ potential.

Consequently, the conductance of the transistor $N_{82}$ again makes an abrupt rise. However, at the moment $t_{82}$ in FIG. 9, the potential of the node $NO_{87}$ to be charged is close to its final potential (for instance, assuming that the threshold voltage of the transistor $N_{82}$ is 0.8 V, a potential equal to or higher than 80% of $V_{cc}$−0.8 V), and thus the potential at the node $NO_{87}$ to be charged will approach its final potential while the value of the charging current $I_{cc8}$ is being reduced. Subsequently, if the second control signal $\phi_5$ becomes "1"-level, then the transistors $P_{81}$ and $P_{83}$ are turned OFF, the transistor $N_{81}$ is turned ON and the precharge control signal $\phi_6$ becomes "0"-level. After a predetermined period, the first control signal $\phi_1$ becomes "1"-level, so that the node $NO_{87}$ to be charged becomes "0"-level.

Three preferred embodiments and one example of an application of the invention have been described above. The advantages realized through the use of the present invention will now be explained.

Figure 10:
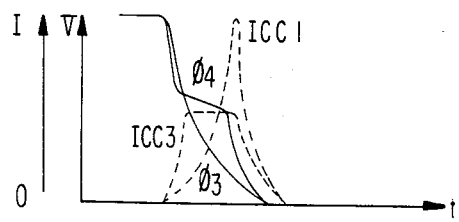
FIG. 10 is a timing chart for representing the comparison between the prior art and the present invention.

In FIG. 10 are illustrated waveforms of the precharge signals and the charging current in the prior art and according to the present invention. In this figure, a waveform $\phi_3$ is the precharge signal in the prior art shown in FIG. 1 and a waveform $\phi_4$ shows a precharge signal according to the present invention. A waveform $I_{cc1}$ shows a charging current for a node to be charged in the prior art, while a waveform $I_{cc3}$ shows a charging current for a node to be charged according to the present invention. If potential fall arises just as the precharge control signal $\phi_3$ in the prior art, then the conductance of the transistor $P_{12}$ shown in FIG. 1 would increase abruptly, and hence a large peak value appears in the charging current $I_{cc1}$ for the node $NO_{11}$ to be charged. However, as is the case with the precharge signal $\phi_4$ according to the present invention, if the slope of the potential fall is temporarily moderated at an intermediate potential, then the rise of the conductance of the transistor $P_{32}$ shown in FIG. 3 becomes moderate. Hence, the waveform of the charging current $I_{cc3}$ for the node $NO_{37}$ to be charged takes the shape of a trapezoid, as compared to the wave form of an accute-angled isosceles triangle of the charging current $I_{cc1}$. The peak value of the current can be reduced (for example up to 60% of the prior art) without extending the charging time and without changing the area of the figure formed of the waveform curve of the charging current and a portion of the time axis in FIG. 10, which area indicates the total quantity of the electric charges supplied to the node to be charged by the charging current. In general, with a printed circuit or the like on which individual parts are mounted, if the peak current upon operation of the parts is large, it would become a source of harmful noises, and therefore, reduction of the peak current is very effective to reduce noise.

It is to be noted that the present invention should not be limited to the above-described preferred embodiments, but obviously various other embodiments could be made within the scope which fulfils the essence of the present invention.

I claim:

1. A digital circuit comprising a first terminal to which a first potential is applied, a circuit node, a first transistor coupled between said first terminal and said circuit node, first means for receiving a precharge command signal, second means responsive to said precharge command signal for operatively generating a precharge control signal which changes from a first level towards a second level with a first time rate of change when a potential of said precharge control signal is near said first level and near said second level and with a second time rate of change smaller than said first time rate when the potential of said precharge control signal is near an intermediate level of said first and second levels, said first level making said first transistor non-conducting, said second level making said first transistor conducting, third means for directly supplying a control electrode of said first transistor with said precharge control signal without changing the waveform of said precharge control signal thereby to charge said circuit node with said first potential, and fourth means for selectively discharging said circuit node in response to an input signal only after said circuit node is charged by said third means, wherein a logic output is generated at said circuit node.

2. The circuit according to claim 1, wherein said fourth means includes a second transistor coupled between said circuit node and a second terminal to which a second potential is applied.

3. The circuit according to claim 1, in which said second means includes an output node, a first node to which a potential of said first level is applied, a second node to which a potential of said second level is applied, a second transistor coupled between said first node and said output node, third and fourth transistors coupled between said output node and said second node in parallel, the conductance of said third transistor being larger than that of said fourth transistor, means for rendering said second transistor conductive in response to said precharge command signal attaining a first value, means for rendering said third transistor conductive when said precharge command signal has attained a second value different from said first value and the voltage potential at said output node is not near said intermediate level, and means for causing said fourth transistor to conduct when the voltage potential at said output node is near said intermediate level.

4. A precharge control circuit for generating a precharge control signal to be applied to a control electrode of a precharge transistor for precharging a data node with a precharge potential comprising:

first and second transistor means for producing said precharge control signal in response to a precharge command signal having first and second logic levels the current paths of said first and second transistor means being provided between an output terminal and a predetermined potential in parallel, the conductance of said first transistor means being set substantially different from that of said second transistor means said predetermined potential rendering said precharge transistor conductive, circuit means for causing said first transistor means to be conductive and said second transistor means non-conductive when said precharge command signal changes from said first logic level to said second logic level and for causing said second transistor means to be conductive and said first transistor means non-conductive a predetermined time interval after the precharge command signal has started to change from said first to said second logic level, and for causing said first transistor means to again become conductive and said second transistor means non-conductive when said precharge command signal returns to its first logic level from its second logic level.

5. The circuit of claim 4, wherein;

said first transistor means is comprised of first and second field effect transistors, the gate of said first transistor being connected to receive said precharge command signal, the gate of said second field effect transistor being connected to a logic circuit for selectively causing said second transistor to conduct and, said second transistor means is comprised of third and fourth field effect transistors, the gate of said third transistor being connected to receive said precharge command signal, the gate of said fourth field effect transistor being connected to said logic circuit for selectively causing said fourth field effect transistor to conduct.

6. The circuit of claim 5, wherein said logic circuit comprises first delay means connected to receive said precharge command signal, the output from said first delay means being connected to a second delay means, the gate of said fourth field effect transistor and a logic gate, the output of said logic gate being connected to said second field effect transistor, and inverter means for inverting the output from said second delay means and applying said inverted output as a second input to said logic gate.

7. A digital circuit comprising: a first transistor with its drain-source coupled between a first voltage terminal and a data node, a second transistor with its drain-source coupled between said data node and a second voltage terminal, means responsive to a logic signal for selectively rendering said second transistor conductive, means for receiving a first signal, control means responsive to said first signal for generating a second signal having first and second levels at its output terminal, said second signal changing from said first level to said second level through consecutive first to third periods of time in response to said first signal, and means for applying said second signal to a gate of said first transistor, said second transistor assuming a conductive state and a non-conductive state in response to said second and first levels, respectively, said control means including third and fourth transistors, first connecting means for connecting a drain-source path of said third transistor between said output terminal and a predetermined potential corresponding to said second logic level, and second connecting means for connecting a drain-source path of said fourth transistor between said output terminal and said predetermined potential, the conductance of said third transistor being set substantially different from that of said fourth transistor, circuit means for causing said third transistor to be conductive and said fourth transistor to be non-conductive during said first and third periods of time and for causing said third transistor to be non-conductive and said fourth transistor to be conductive during said second period of time.

8. The circuit acording to claim 7, wherein said first connecting means includes a fifth transistor whose drain-source path is connected in series with respect to said third transistor, the gate of said fifth transistor being connected to receive said first signal, and said second connecting means includes a sixth transistor whose drain-source path is connected in series with respect to said fourth transistor, the gate of said sixth transistor being connected to receive said first signal.

9. The circuit according to claim 8, wherein said control means includes first delay means connected to receive said first signal, the output from said first delay means being connected to a second delay means, the gate of said fourth transistor and a logic gate, the output of said logic gate being connected to said third transistor, and inverter means for inverting the output from said second delay means and applying said inverted output as a second input to said logic gate.

10. A digital circuit comprising: first means receiving a first signal which changes from one of two binary logic levels to the other of the binary logic levels with a first waveform of a single slope, second means responsive to a change of said first signal from the one of two binary logic levels towards the other of the binary logic levels for generating a second signal which changes from a first level to a second level with a second waveform, said second waveform assuming a first slope when said second signal is near an intermediate level of said first and second binary levels and with a second slope when said second signal is not near said intermediate level, the degree of said second slope being larger than that of said first slope, and transistor means connected to receive said second signal for generating a controlled amount of electric current in response to said second signal.

* * * * *